United States Patent
Huang

(10) Patent No.: US 6,767,753 B2
(45) Date of Patent: Jul. 27, 2004

(54) IMAGE SENSOR OF A QUAD FLAT PACKAGE

(75) Inventor: Chien-Ping Huang, Hsinchu Hsien (TW)

(73) Assignee: Siliconware Precision Industries Co., Ltd., Taichung Hsien (TW)

( * ) Notice: Subject to any disclaimer, the term of this patent is extended or adjusted under 35 U.S.C. 154(b) by 6 days.

(21) Appl. No.: 10/341,086

(22) Filed: Jan. 13, 2003

(65) Prior Publication Data

US 2003/0103339 A1 Jun. 5, 2003

Related U.S. Application Data

(62) Division of application No. 10/037,895, filed on Oct. 22, 2001, now Pat. No. 6,545,332.

(30) Foreign Application Priority Data

Jan. 17, 2001 (TW) .................................. 90101003 A

(51) Int. Cl.[7] .................. H01L 21/00; H01L 21/44; H01L 21/48; H01L 21/50; H01L 23/02
(52) U.S. Cl. ........................ 438/25; 438/64; 438/116; 438/125; 257/680
(58) Field of Search ............................ 438/25, 64, 116, 438/125; 257/680

(56) References Cited

U.S. PATENT DOCUMENTS 4,769,344 A * 9/1988 Sakai et al. ................... 29/827

FOREIGN PATENT DOCUMENTS

WO    WO 96/12303    * 4/1996

* cited by examiner

Primary Examiner—Jack Chen
Assistant Examiner—Nema Berezny
(74) Attorney, Agent, or Firm—J.C. Patents

(57) ABSTRACT

An image sensor of a quad flat non-leaded package (QFN). The image sensor of a quad flat non-leaded package includes a lead frame having a plurality of leads and a die pad, and the leads are located around a periphery of the die pad. A molding structure is formed around an outer boundary of the leads and located on a first surface of the lead frame. A plurality of bonding pads is formed on the active surface of a chip. A plurality of wires is utilized to electrically connect the bonding pads respectively to bonding portions of the leads on a first surface of the lead frame. A liquid compound is filled in between the chip and the molding structure and covering portions of the leads. A transmittance lid is allocated over the active surface, sealing the space between the molding structure and the lead frame.

9 Claims, 7 Drawing Sheets

IMAGE SENSOR OF A QUAD FLAT PACKAGE

CROSS-REFERENCE TO RELATED APPLICATION

This application is a divisional application of, and claims the priority benefit of, U.S. application Ser. No. 10/037,895 filed on Oct. 22, 2001 now U.S. Pat. No. 6,545,332.

BACKGROUND OF THE INVENTION

1. Field of Invention

The present invention relates generally to an image sensor package and a fabrication method thereof. More particularly, the present invention relates to an image sensor of a quad flat non-leaded package (QFN) and a fabrication method thereof.

2. Description of the Related Art

During the past few years, photography in all its forms has been used more frequently. Integrated circuits (IC) and other sophisticated electronics are now commonplace in cameras of all kinds and sizes. Since consumers expect more from their digital cameras and video products, digital imaging technology increasingly improves the quality of images and reduces product costs. The image sensors comprise charge-coupled devices (CDD) and complementary metal oxide semiconductor (CMOS) digital image sensors, for example. CDD and CMOS digital image sensors receive external light and transfer it into digital signals. Therefore, those digital image sensors are expected to deeply penetrate the high-tech market.

Since image sensors need to absorb light, the packaging method of the image sensor is different from the packaging method of a general electronics product. U.S. Pat. No. 5,523,608 and U.S. Pat. No. 5,529,959 disclose a package structure that utilizes a plastic quad flat package (PQFP) to package an image sensor. However, the conventional method provides a large size package structure; thus the conventional package structure is not suitable for a high-density package. U.S. Pat. No. 5,898,218 and U.S. Pat. No. 5,270,491 describe a conventional method of utilizing a ceramic carrier, such as a ceramic leadless chip carrier (LCC), to package the image sensor. Although LCC has a better hermetically sealed characteristic and is highly durable, the cost of the fabrication is very high and the fabricating process is complicated. Thus, the ceramic carrier is not suitable for a low-cost packaging market. Another conventional method is disclosed in U.S. Pat. No. 5,811,799, which utilizes a laminated substrate as a carrier for a plastic package of an image sensor. The laminated substrate is formed as a non-leaded carrier. Although the size of this type of package can be reduced, the cost is higher because the carrier uses a material of flame-retardant epoxy-glass fabric composite resin, FR-4, FR-5, or bismaleimide-triazine (BT).

The image sensor package normally comprises a transmittance lid, molding structure, conductive wires, a carrier and an image sensor. In order to allow the image sensor to receive light, a good transmittancy between the active region of the image sensor to the transmittance lid is required. A conventional method to improve the transmittancy is to use a glass lid or a transmittance plastic lid. Glass has better transmittancy. The air between the image sensor and the transmittance lid is vacuumed out so that an air expansion inside the device can be prevented when the device is subjected to heat. Thus, a highly sensitive image sensor package usually utilizes a vacuum method. However, another method is suggested by filling a space between the image sensor and the transmittance lid with a transmittance material or epoxy in order to replace the vacuum method. When the transmittance material or epoxy is used to fill the space between the transmittance lid and the image sensor, the transmittancy of the transmittance material is not as good as the vacuum status. A transmittance material that has high temperature resistance and high inertness properties, but it is very costly; thus, this method is not effective and is not widely used.

Since image sensors are generally utilized on portable products such as a digital camera, or even an image capturing device of a telephone in the future, image sensor devices require shock resistance. Tests performed on the fabrication process become very important to ensure producing high quality of image sensors. The reliability test and the centrifugal test are usually performed during the fabrication process. Conventional testing equipment disclosed in U.S. Pat. No. 5,523,608 uses only a thin layer of molding compound to encapsulate leads and a die pad. During the reliability test, the package structure is detached due to the poor bonding. If the length of the conductive wire is too long, it will be deformed during the centrifugal test; thus, the reliability of the package is reduced.

SUMMARY OF THE INVENTION

It is an object of the present invention to provide an image sensor of a quad flat non-leaded package (QFN), comprising: a lead frame having a plurality of leads and a die pad. The leads are located around a periphery of the die pad, and the lead frame has a first surface and a corresponding second surface, each lead having a bonding portion. A molding structure is formed around an outer boundary of the leads and located on the first surface of the lead frame. The molding structure and the lead frame are arranged in such a way that a space is formed. A chip has an active surface and a corresponding back surface. A plurality of bonding pads is formed on the active surface, and the chip is located in the space and the back surface of the chip is adhered onto a first surface of the die pad. A plurality of wires is utilized to electrically connect the bonding pads respectively to the bonding portions of the leads on the first surface of the lead frame. A liquid compound is filled in between the chip and the molding structure, covering portions of the wires. A surface of the liquid compound is approximately coplanar to the active surface of the chip. A transmittance lid is allocated over the active surface of the chip to seal the space.

It is another object of the present invention to provide a carrier having an insulating body and a plurality of leads. The leads are fixed in the insulating body and a cavity is formed in the insulating body. An image sensor chip has an active surface and a corresponding back surface. A plurality of bonding pads is formed on the active surface of the chip, and the back surface of the chip is adhered onto a bottom surface of the cavity. A plurality of wires, electrically connect the bonding pads respectively to the leads. A liquid compound is filled in between the chip and the insulating body, covering portions of the wires. A top surface of the liquid compound is approximately coplanar to the active surface of the chip. A lid is located over the active surface, sealing the cavity.

A further objective of the present invention is to provide a method of fabricating an image sensor of a QFN, comprising the following steps. A lead frame having a plurality of package units is provided. Each package unit has at least a die pad and a plurality of leads. The leads are formed around a periphery of the die pad, and each lead has a bonding portion. The lead frame further has a first surface and a corresponding second surface. A molding process is performed, and at least a molding structure is formed on the first surface of the lead frame. The molding structure surrounds an outer boundary of the leads and covers gaps between the die pad and the leads. A first surface of the die pad and the bonding portions of the leads are exposed. The lead frame and the molding structure of every package unit are arranged in such a way that a space is formed for locating a chip. A plurality of chips is provided, wherein each chip comprises an active surface and a corresponding back surface. A plurality of bonding pads is formed on the active surface of each chip. A die attaching process is performed, each chip is placed respectively in the space, and the back surface of the chip is adhered onto the first surface of the die pad. A wire bonding process is carried out to utilize wires to electrically connect the bonding pads to the bonding portions of the leads.

This is followed by performing a dispensing process, wherein a liquid compound is filled in between the chip and the molding structure and covered portions of the wires. A top surface of the liquid compound is approximately coplanar to the active surface of the chip. A transmittance material is located over the active surface of the chip to seal the space. A singulating process is performed to separate the package units.

Both the foregoing general description and the following detailed description are exemplary and explanatory only and are not restrictive of the invention as claimed.

BRIEF DESCRIPTION OF THE DRAWINGS

The accompanying drawings are included to provide a further understanding of the present invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

FIGS. 1–6 illustrate cross-sectional views of a method of fabricating an image sensor of a QFN in accordance with a preferred embodiment of the present invention.

Figure 1:
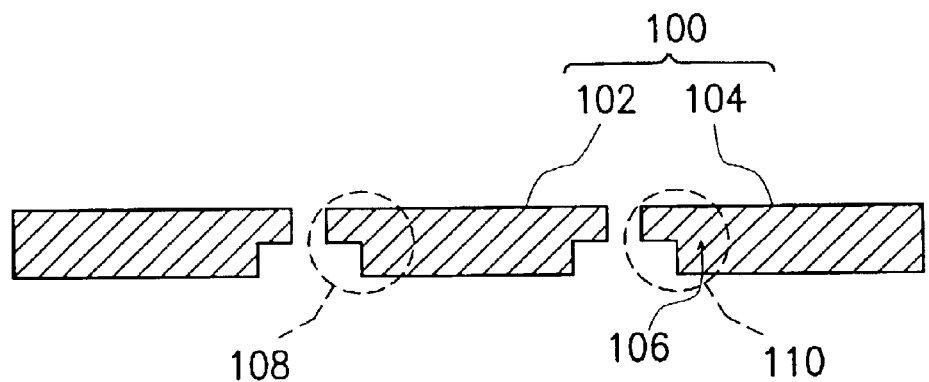
FIGS. 1–6 are diagrams of an image sensor of a QFN in accordance with a preferred embodiment of the present invention.

The image sensor of the QFN of the present invention is built on a lead frame 100, on which a die pad 102 and a plurality of leads 104 are formed. The leads 104 are located peripherally around the boundary of the die pad 102. A plurality of the die pads 102 and a plurality of bonding portions 106 of the leads 104 is formed into step structures such as 108 and 110, which are shown in FIG. 1. The step structures 108 and 110 are formed by utilizing a half-etched method or a coin method, for example, to reduce the thickness of certain portions. This structure can improve the bonding ability between the lead frame 100 and a molding compound in a later fabricating process.

Figure 2:
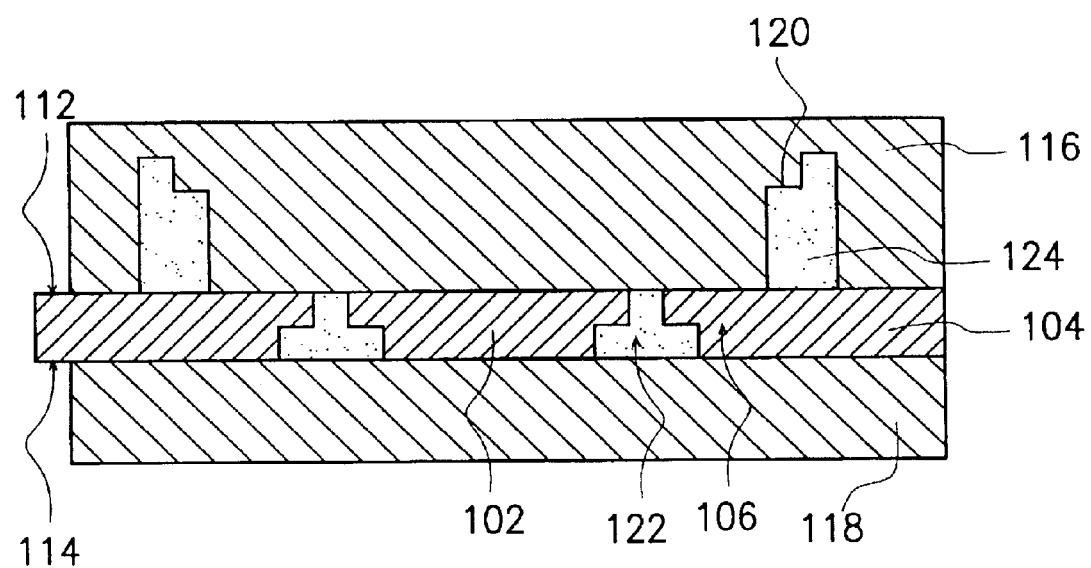

Referring to FIG. 2, a molding process is carried out to form a molding structure 124. The lead frame 100 is located in a mold and is grasped by a top mold 116 and a bottom mold 118, wherein the top mold 116 is a type of an insert mold. A first surface 112 of the die pad 102 and the bonding portions 106 of the leads 104 are grasped by the top mold 116. A mold cavity 120 is formed at an outer boundary of the leads 104. A second surface 114 of the lead frame 100 is grasped by the bottom mold 118. During molding, a molding material such as epoxy is filled into the mold cavity 120, and the gaps 122 between leads 104 and the die pad 102. The molding material is allowed to cure to form a molding structure 124. The epoxy has a low cost and thus can be utilized in mass production to lower the cost. It is worthy of mentioning that during a pre-mold process of forming a carrier in accordance with a conventional PQFP method, flash often occurs on the bonding portions and the top surface of the die pad. Thus, a cleaning step is required. Otherwise the flash will affect die adhesion in a following step, and it can cause an electrical connection problem between the wires and the leads during a wire bonding process. The yield and reliability of the product are adversely affected. It is an object of the present invention to provide a packaging method that can prevent flash from occurring. The die pad 102 and the bonding portions 106 of the present invention are both grasped by the top mold 116 and the bottom mold 118 to prevent flash from occurring. Thus, no cleaning step is required, and the yield and the reliability of the product are greatly improved.

Figure 3:
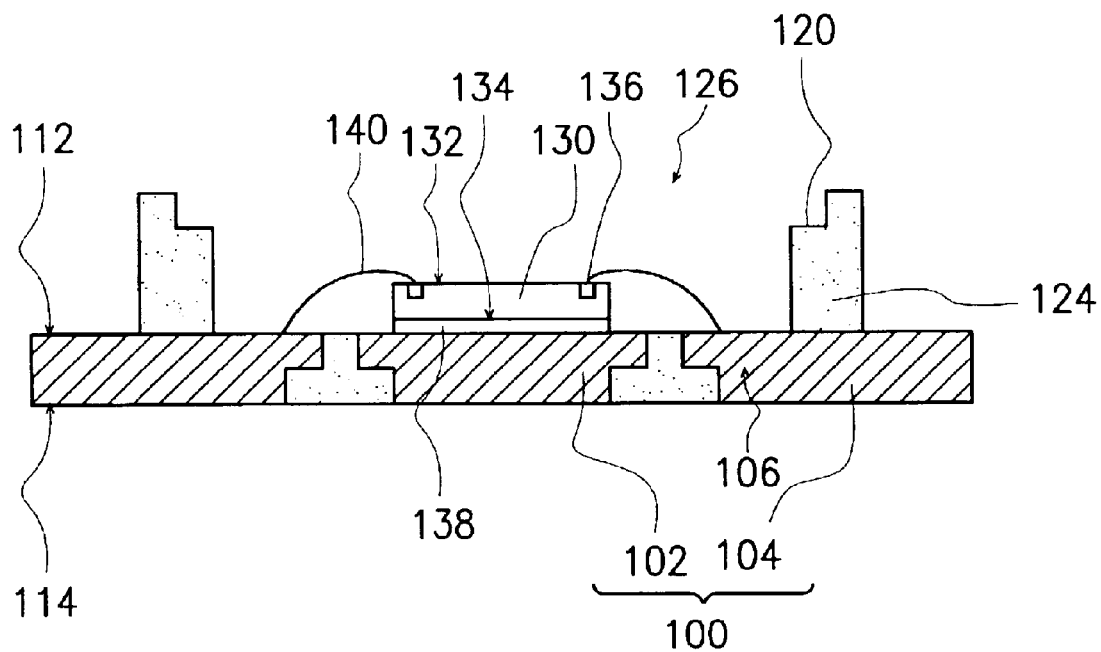

Referring to FIG. 3, a space 126 is formed due to an arrangement between the molding structure 124 and the lead frame 100. A die attaching process is carried out to adhere a chip 130 on the die pad 102. The chip 130 is located in the space 126, and aback surface 134 of the chip 130 is adhered onto the first surface 112 of the die pad 102 by an adhesive material 138. A wire bonding process is performed by utilizing a plurality of wires 140 such as thin aluminum wires, copper wires or gold wires, electrically connecting a plurality of bonding pads 136 to the bonding portions 106 of the leads 104, in which the bonding pads 136 are located on the active surface 132 of the chip 130.

Figure 4:
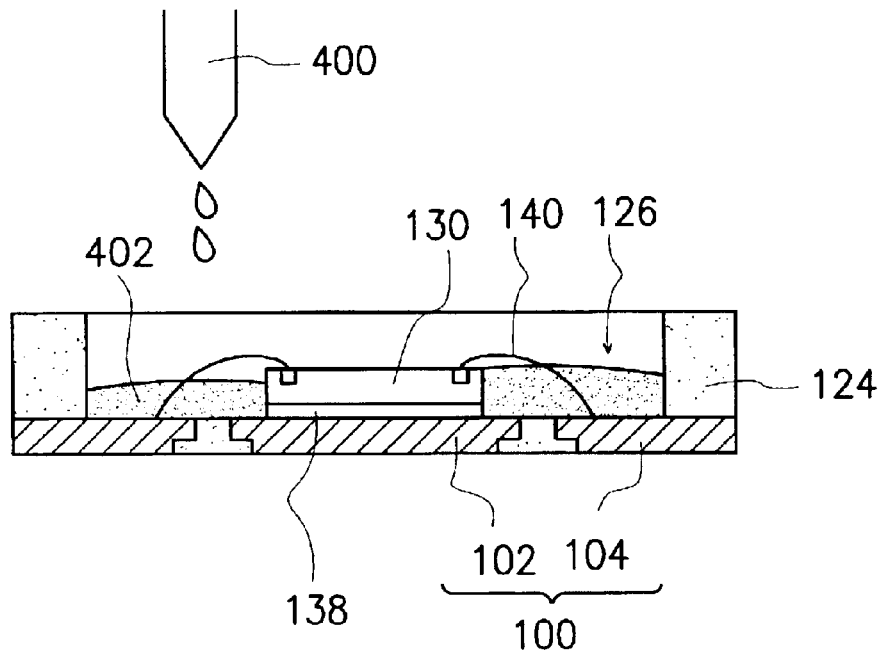

Referring to FIG. 4, a dispensing process is performed after the die attaching and the wire bonding processes. An injector 400, such as a nozzle, dropper or a syringe, injects a liquid compound 402 into the space 126 between the chip 130 and the molding structure 124 and covers portions of the wires 140. The surface of the liquid compound 402 can be lower than the active surface 132 of the chip 130, but it is preferable that the surface of the liquid compound 402 be at the same level as the active surface 132. The liquid compound 402 can be a common material used in packaging, for example an epoxy. A curing process is required. The dispensing process can be carried out in a vacuum environment. After the curing process, the liquid compound 402 fixes the chip 130 and portions of the wires 140 in place. However, the active surface 132 of the chip 130 and the bonding pads 136 are exposed in the vacuum.

Figure 5:
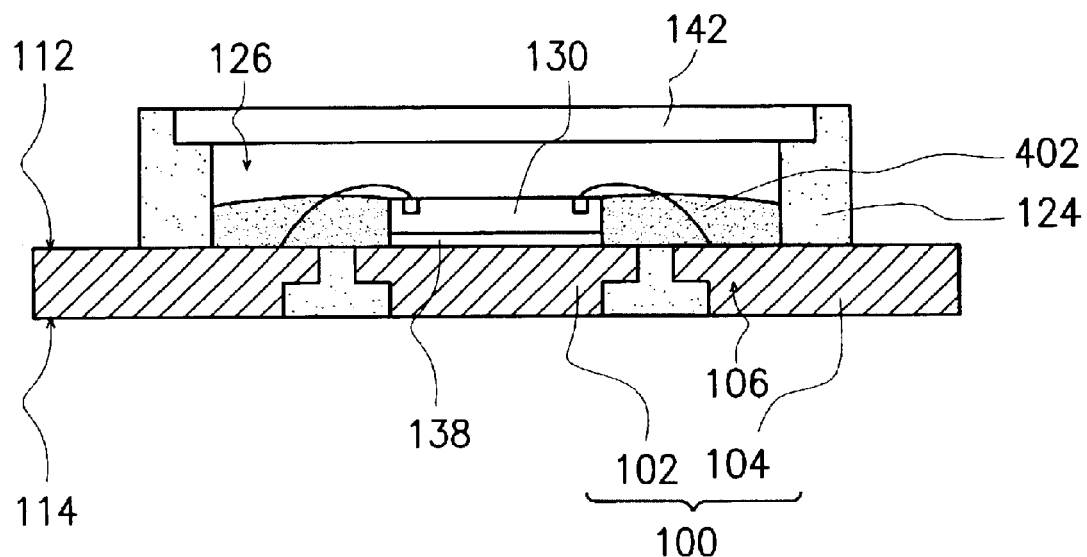

Referring to FIG. 5, a sealing process is performed next to vacuum the air out from the space 126. A transmittance lid 142 is adhered onto the molding structure 124 to seal a top portion of the molding structure 124 in order to prevent any contact between the chip 130 and an external environment. On the other hand, a region of an image sensor located on the chip 130 can receive external light through the transmittance lid 142. The transmittance lid 142 can be a transmittance glass lid or a transmittance plastic lid or a focus lens that can focus light.

Figure 6:
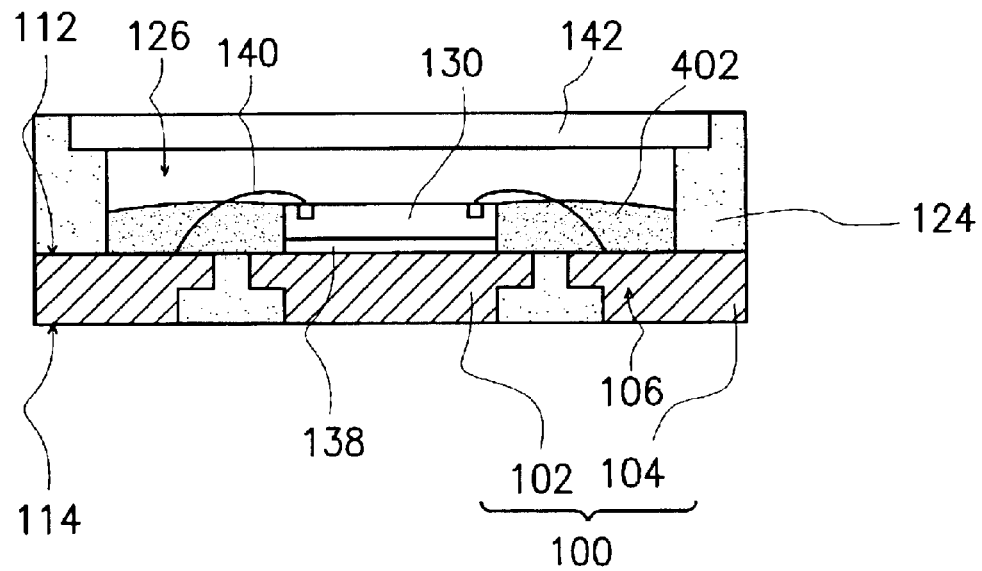

Referring to FIG. 6, a singulation process is carried out to cut off portions of the lead frame 100, so that the leads 104 are flush with the molding structure 124. Thus a non-leaded structure is formed. The second surface 114 of the leads 104 is utilized as an external node for the non-leaded image sensor package.

The present invention provides a method of utilizing a liquid compound to fill the space between the chip and the molding structure, and covering portions of the wires, wherein this method can be utilized in PQFP and LCC.

Figure 7:
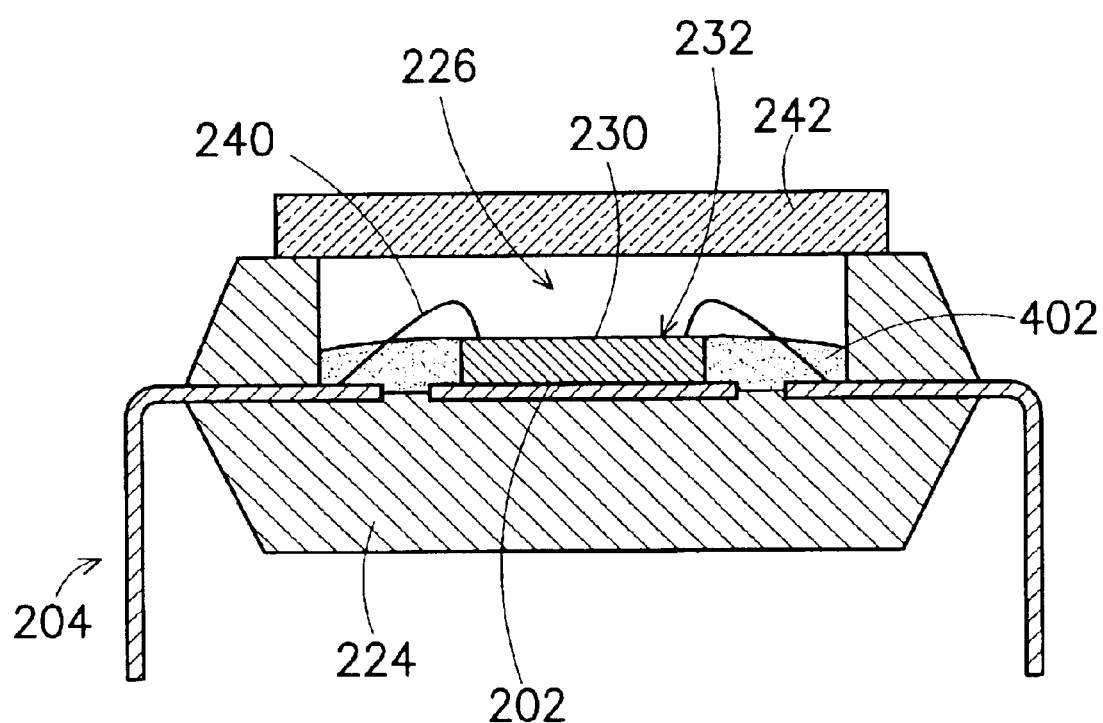
FIG. 7 is a diagram showing a method of packaging a PQFP in accordance with another preferred embodiment of the present invention.

FIG. 7 illustrates a packaging method of utilizing the present invention in a PQFP. A lead frame for a QFP is first provided. The above-described molding method is performed, and a die pad 202 and the tips of leads 204 are grasped by a top mold and a bottom mold. First of all, a thermal setting epoxy or a similar material is filled into a space between the top mold and the bottom mold. After a curing process, the thermal setting epoxy in the top mold and the bottom mold define a profile of a molding structure 224. Referring to FIG. 7, the molding structure 224 can be formed into a boat-like structure. A space 226 is formed due to an arrangement between the lead frame and molding structure 224. An additional heating may be required so that the molding structure 224 can be completely solidified. A chip 230 of an image sensor is adhered onto the die pad 202. A wire bonding process is carried out to electrically connect the chip 230 to the leads 204 by a plurality of wires 240, such as thin aluminum wires, copper wires or gold wires. A liquid compound 402 is filled into gaps between the chip 230 and the molding structure 224, and a surface of the liquid compound 402 is preferably flush with an active surface 232 of the chip 230. The liquid compound 402 covers portions of the wires 240, and fixes the chip 230 and portions of the wires 240 in place. The air of the space 226 is vacuumed out and a transmittance lid 242 is adhered on the molding structure 224 in order to seal the space 226.

Figure 8:
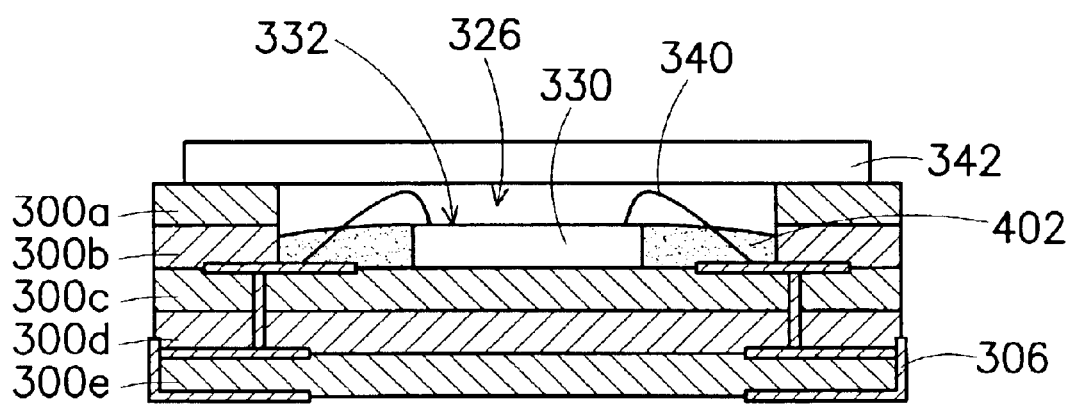
FIG. 8 is a diagram showing a method of packaging an LCC in accordance with the other preferred embodiment of the present invention.

FIG. 8 illustrates a packaging method of the present invention utilized in a LCC. An LCC is generally formed by a plurality of ceramic substrates stacked together, such as 300a, 300b, 300c, 300d and 300e, as shown in FIG. 8. An electrical device, such as a sensor chip 330 used in the preferred embodiment, is located in a space 326. Instead of using the lead frame and the leads, the LCC utilizes a plurality of connecting parts 306 to electrically connect to the sensor chip 330. The connecting parts 306 are made of materials such as tungsten, nickel, gold or a combination thereof in accordance with requirements of the electrical device to form a corresponding pattern in between each ceramic substrate. Exposed portions of the connecting parts 306 in the space 326 are connected to the sensor chip 330 by the wires 340. A liquid compound 402 such as epoxy is filled into the gaps between the chip 330 and the ceramic 300a, 300b. The liquid compound 402 is filled up to a level that is coplanar with the active surface 332 of the chip 330. The process can be performed in a vacuum condition. After curing, the air of the space 326 is vacuumed out, and a transmittance lid 342 is adhered on the top of the ceramic substrate 300a. Thus the space 326 is sealed.

In the above-mentioned embodiment, a peripheral region of the die pad and the bonding portion of the leads are designed into a step-like structure shown in FIGS. 4 and 6. However, the image sensor of the QFN is not limited to the above-described structure. The package structure can be designed according to the requirements of the packaging products. For example, the molding structure can be formed on the bottom surface of the die pad. The die pad of the lead frame can be designed according to the requirements of the products. For example, an area of the die pad can be designed smaller than the chip in order to reduce thermal stress between the die pad and the chip, or the die pad can be formed into a loop shape around the periphery of the chip, or even a non-die pad design can be utilized.

A single package unit is used to explain the technique of the above-mentioned embodiment. However, the fabricating method of the present invention is not limited to a single package unit only. On the contrary, the image sensor of a QFN of the present invention can be utilized in mass production. In mass production, a lead frame can comprise a plurality of package units; thus, the production line can automatically package a plurality of chips simultaneously.

Figure 9:
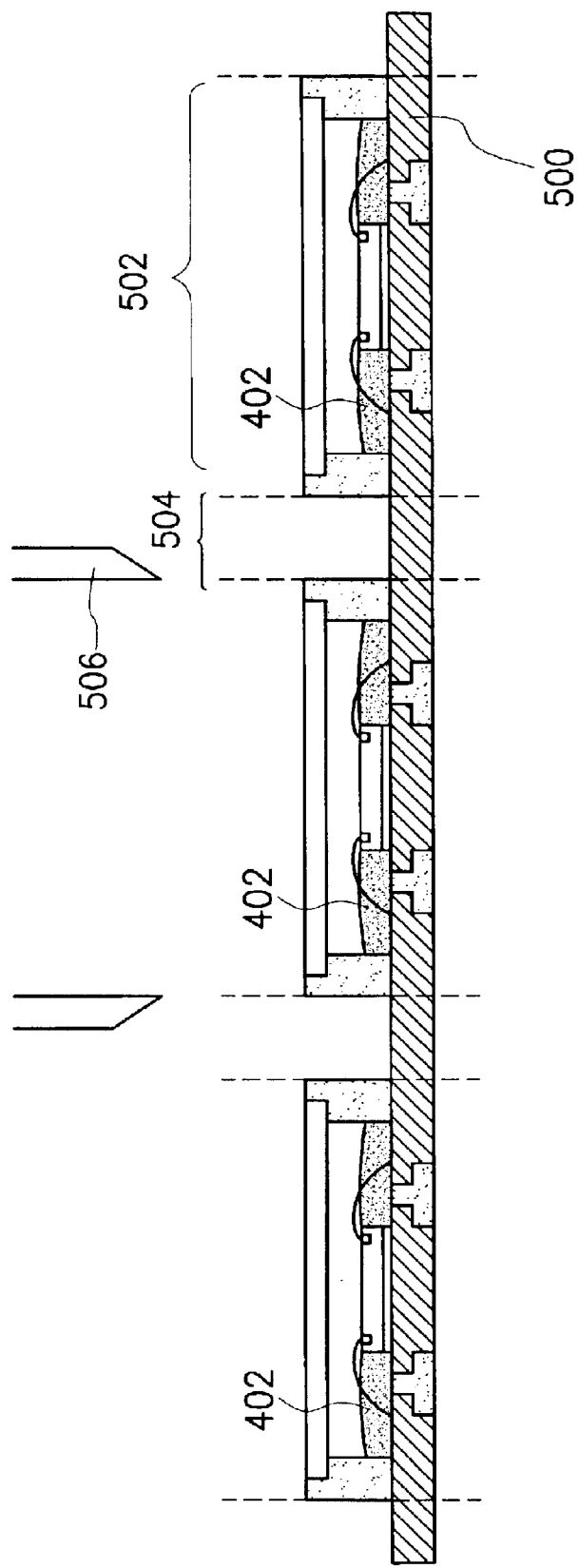
FIG. 9 is a diagram of an image sensor of a QFN in mass production in accordance with a preferred embodiment of the present invention.

FIG. 9 illustrates an image sensor of a QFN in mass production in accordance with an embodiment of the present invention. The lead frame 500, which comprises a plurality of package units 502, is fabricated into a strip-shape, so that the package units 502 are arranged along the strip-shaped lead frame 500. A determinate gap 504 is in between each package unit 502. Thus, during a singulating process, the package units can be separated. Since the production line is automatic, the package units 502 can simultaneously undergo a process such as a molding process. In the singulation of this type of structure, a punch out method is utilized. A blade-shaped puncher 506 punches each package unit 502 out from the lead frame 500.

Figure 10:
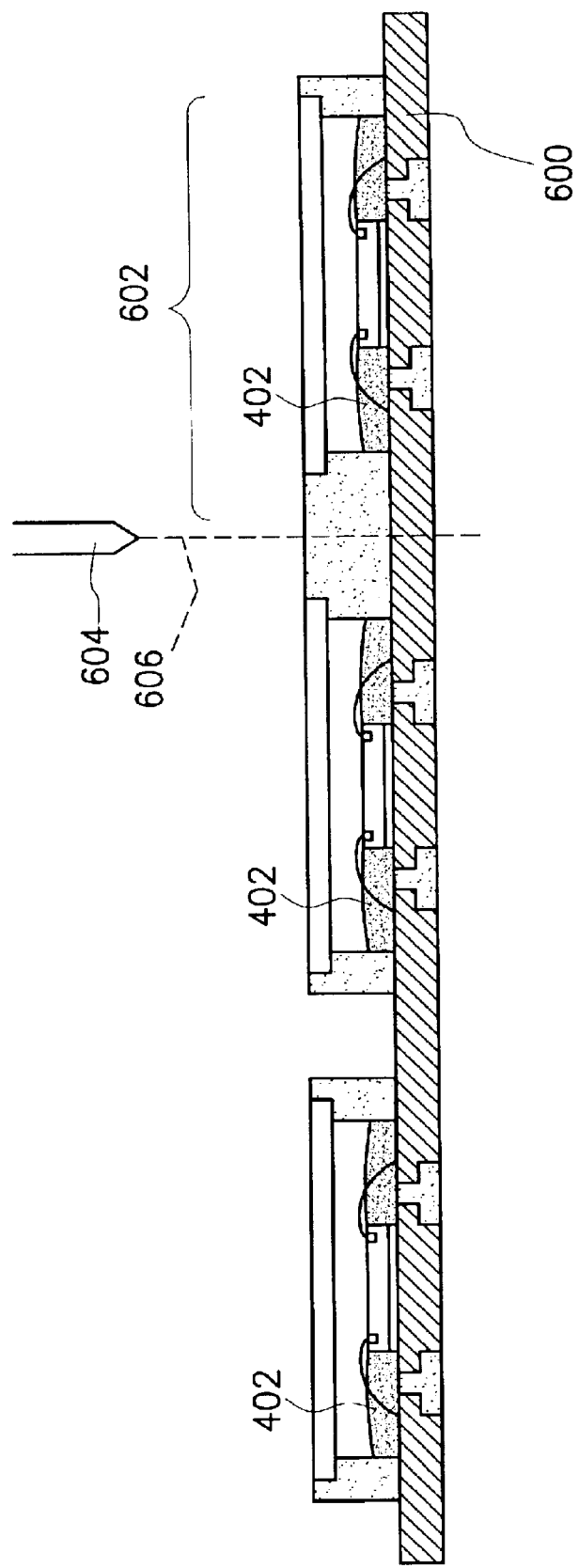
FIG. 10 is a diagram of an image sensor of a QFN in mass production in accordance with another preferred embodiment of the present invention.

Referring to FIG. 10, an image sensor of a QFN in mass production in accordance with another embodiment of the present invention is shown. A plurality of package units 602 is closely arrayed to each other on a lead frame 600. The package units 602 simultaneously undergo a molding process, and a sawing method is used to separate each package unit 602. A blade 604 or a laser is used to cut along a scribe line 606 on the lead frame 600 in order to separate each package unit 602. The area array structure of this embodiment allows the lead frame to be utilized. Thus, the material cost can be reduced to increase productivity.

The image sensor of the QFN of the present invention utilizes a liquid compound to fill the gaps between the chip and the molding structure, and it covers portions of the wires. Therefore, the packaging structure of the present invention can be strengthened to prevent the die pad and leads from delaminating and protecting the wires from deforming. The yield and the reliability of the product are improved. The packaging method also can be utilized for PQFP and LCC packages.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A method of fabricating a QFN for an image sensor, the steps of the method comprising:

providing a lead frame having a plurality of package units, wherein each package unit has at least a die pad and a plurality of leads, wherein the leads are formed around a periphery of the die pad, each lead having a bonding portion, and the lead frame further having a first surface and a corresponding second surface;

performing a molding process, wherein at least a molding structure is farmed on the first surface of the lead frame and the molding structure surrounds an outer boundary of the leads, wherein the molding structure covers a gap between the die pad and the leads, and exposes a first surface of the die pad and the bonding portions of the leads, wherein the molding structure and the lead frame are arranged in such a way that a space is formed;

providing a plurality of chips, wherein each chip comprises an active surface and a corresponding back surface, and a plurality of bonding pads are formed on the active surface;

performing a die attaching process, wherein each chip is placed respectively in the space, and the back surface of the chip is adhered onto the first surface of the die pad;

performing a wire bonding process, wherein a plurality of wires is utilized to electrically connect the bonding pads to the bonding portions of the leads;

performing a dispensing process, wherein a liquid compound filled in between the chip and the molding structure and covered portions of the wires, and a top surface of the liquid compound is approximately coplanar to the active surface of the chip;

performing a sealing process, wherein a transmittance material is located over the active surface of the chip to seal the space; and performing a singulating process, wherein each package unit is separated from each other.

2. The method of claim 1, wherein the bonding portions of the leads and the periphery of the die pad are formed into step structures, in which the molding structure covers the step structures.

3. The method of claim 1, wherein a material of the molding structure includes epoxy.

4. The method of claim 1, wherein the step of performing the molding process comprises providing a top mold and a bottom mold, wherein the first surface of the die pad and first surfaces of the leads are grasped by the top mold and the second surface of the lead frame is grasped by the bottom mold.

5. The method of claim 1, wherein the transmittance lid comprises a transmittance glass placed over the top of the space and fixed on the molding structure.

6. The method of claim 1, wherein the transmittance lid comprises a transmittance plastic placed over the top of the space and fixed on the molding structure.

7. The method of claim 1, wherein a curing process is performed after the dispensing process to allow the liquid compound to cure.

8. The method of claim 1, wherein the package units are arranged in an area array, and a sawing method is utilized to separate the package unit.

9. The method of claim 1, wherein the lead frame is formed into a strip-shape, wherein the package units are arranged along the strip-shape of the lead frame, and a predetermined gap is formed in between the package units, wherein a punch out method is utilized to separate the package units.

* * * * *